US011706990B2

(12) United States Patent
Kanning et al.

(10) Patent No.: US 11,706,990 B2
(45) Date of Patent: Jul. 18, 2023

(54) METHOD FOR CALIBRATING AT LEAST ONE SENSOR

(71) Applicant: HELLA GmbH & Co. KGaA, Lippstadt (DE)

(72) Inventors: Bastian Kanning, Bremen (DE); Klaas Hauke Baumgartel, Delmenhorst (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 1323 days.

(21) Appl. No.: 15/988,917

(22) Filed: May 24, 2018

(65) Prior Publication Data
US 2018/0342666 A1 Nov. 29, 2018

(30) Foreign Application Priority Data

May 24, 2017 (DE) ...................... 10 2017 111 370.3

(51) Int. Cl.
*H10N 30/30* (2023.01)
*G01R 35/00* (2006.01)
(Continued)

(52) U.S. Cl.
CPC .......... *H10N 30/302* (2023.02); *G01L 25/00* (2013.01); *G01N 29/30* (2013.01); *G01R 35/005* (2013.01)

(58) Field of Classification Search
CPC . H01L 41/1132; H01L 41/047; G01R 35/005; G01N 29/30; G01L 25/00
See application file for complete search history.

(56) References Cited

U.S. PATENT DOCUMENTS 6,531,884 B1 3/2003 Kleven
6,532,833 B1 3/2003 Lee
(Continued)

FOREIGN PATENT DOCUMENTS

CN 103217552 A * 7/2013 .............. G01P 15/09
CN 103217552 A 7/2013
(Continued)

OTHER PUBLICATIONS

Kappel et al., "Characterization and calibration of piezoelectric polymers: In situ measurements of body vibrations", Review of Scientific Instruments 82, 075110 (2011), (Year: 2011).*
(Continued)

*Primary Examiner* — Giovanni Astacio-Oquendo
*Assistant Examiner* — Dilara Sultana
(74) *Attorney, Agent, or Firm* — Muncy, Geissler, Olds & Lowe, P.C.

(57) ABSTRACT

In a method for calibrating at least one sensor, wherein the sensor includes at least one piezoelectric element with at least one electrode, and wherein at least one electrode is embodied as a measurement electrode, it is provided as essential to the invention that an electrical excitation voltage is applied to at least one further electrode of the piezoelectric element, embodied as a calibration electrode, to create a mechanical deformation of the piezoelectric element, that the voltage induced by the deformation of the piezoelectric element is captured with at least one measurement electrode, and that the applied excitation voltage and captured voltage are compared.

9 Claims, 2 Drawing Sheets

(51) Int. Cl.
  *G01L 25/00* (2006.01)
  *G01N 29/30* (2006.01)

(56) References Cited

U.S. PATENT DOCUMENTS

| | | | |
|---|---|---|---|
| 8,874,323 B2 * | 10/2014 | Ulbrich | B60R 21/0136 |
| | | | 250/221 |
| 9,678,144 B2 | 6/2017 | Lamesch | |
| 2003/0038644 A1 | 2/2003 | Kleven | |
| 2008/0264170 A1 * | 10/2008 | Abbott | G01N 29/022 |
| | | | 73/590 |
| 2010/0005851 A1 * | 1/2010 | Cottles | G01L 27/007 |
| | | | 73/726 |
| 2011/0029287 A1 | 2/2011 | Sohn et al. | |
| 2014/0292351 A1 | 10/2014 | Ivanov | |
| 2015/0301105 A1 | 10/2015 | Lamesch | |

FOREIGN PATENT DOCUMENTS

| | | | | |
|---|---|---|---|---|
| DE | 60213258 T2 | 6/2007 | | |
| DE | 112013005168 T5 | 7/2015 | | |
| JP | H06230026 A * | 8/1994 | | G01P 15/09 |
| JP | H06230026 A | 8/1994 | | |
| TW | 201320599 A1 | 5/2013 | | |

OTHER PUBLICATIONS

Office Action of CN Application No. 201810507973.2 and English translation, dated Jun. 22, 2021, 25 pages.
Chen, "In situ testing and calubration of tube piezolectric scanners", Ultramicroscopy, 42-44, Aug. 12, 1991, 1653-1658, 42-44.

\* cited by examiner

METHOD FOR CALIBRATING AT LEAST ONE SENSOR

BACKGROUND OF THE INVENTION

Field of the Invention

The invention relates to a method for calibrating at least one sensor, wherein the sensor includes at least one piezoelectric element with at least one electrode and wherein at least one electrode is embodied as a measurement electrode. The invention further relates to a sensor device for capturing at least one structure-borne sound signal having at least one piezoelectric element, wherein the piezoelectric element includes at least one electrode embodied as a measurement electrode.

Brief Summary of the Related Art

Sensor devices with piezoelectric elements are used in a wide range of applications. For example, structure-borne sound signals that propagate in objects that are to be monitored can be captured with the aid of sensors with piezoelectric elements. In this context, the deformation of the piezoelectric element caused by a structure-borne noise vibration is captured. For this purpose, a piezoelectric element includes a measurement electrode and a counter electrode. The deformation of the piezoelectric element generates an electrical voltage, with is captured with the measurement electrode with reference to the counter electrode, which functions here as an earth electrode. In order to precisely evaluate the voltage generated by the deformation of the piezoelectric element, the piezoelectric coefficient of the piezoelectric element must be as constant as possible. The piezoelectric coefficient may depend on the temperature and on the degree of polarisation of the piezoelectric element.

SUMMARY OF THE INVENTION

The object underlying the invention is to suggest a method with which a calibration of a sensor is possible with piezoelectric elements.

This object is solved with a method having the features of Claim 1. Advantageous variants and further developments are described in the subclaims.

In a method for calibrating at least one sensor, wherein the sensor includes at least one piezoelectric element with at least one electrode, and wherein at least one electrode is embodied as a measurement electrode, it is provided as essential to the invention that an electrical excitation voltage for creating a mechanical deformation of the piezoelectric element is applied to at least one further electrode of the piezoelectric element, embodied as a calibration electrode, that the voltage produced by the deformation of the piezoelectric element is captured with at least one measurement electrode, that the excitation voltage applied and the voltage captured are compared, and that an electrical field formed between the calibration electrode and the measurement electrode is calculated, and the calculation of the electrical field is incorporated in the calculation of the calibration factor.

A sensor with a piezoelectric element has at least one electrode, wherein the electrode is embodied as a measurement electrode. An earth electrode or also a counter electrode is assigned to the measurement electrode, in comparison with which a voltage generated by the piezoelectric effect due to deformation of the piezoelectric element is measured. Besides the measurement electrode and the earth electrode, the sensor is also equipped with another electrode, which is embodied as a calibration electrode. A voltage is applied to the calibration electrode, said voltage being generated between the counter electrode and the calibration electrode. The voltage that is applied to the calibration electrode causes a deformation of the piezoelectric element as a result of the piezoelectric effect. The deformation of the piezoelectric element induces a voltage which is measurable with the measurement electrode in comparison to the counter electrode. The quality of the piezoelectric element which is being used may thus be assessed by comparing the voltage applied via the calibration element with the voltage that is captured by the measurement electrode. Ideally, the captured voltage and the applied voltage are the same. The quality of the piezoelectric element may be described by the piezoelectric coefficient, which may be dependent on both the temperature and the degree of polarisation of the piezoelectric element. A piezoelectric coefficient that was diminishing due to ageing for example would have the effect of less deformation when a voltage was applied to the calibration electrode. Consequently only a relatively small piezoelectric voltage would be generated by the deformation for measurement with by the measurement electrode. Thus, a calibration factor may be calculated from the applied voltage and measured voltage, and this may be taken into account in the evaluation of the data captured by the measurement electrode. Ageing effects can also be adjusted in the evaluation by the calibration factor. An electrical field may form between the calibration electrode and the measurement electrode. The electrical field formed may influence the measurement of the voltage generated at the piezoelectric element. The calculation of the electrical field between the calibration electrode and the measurement electrode is thus included in the calculation of the calibration factor.

In a further development of the method, the deformation of the piezoelectric element is a contraction, particularly a transversal contraction, of the piezoelectric element. When a voltage is applied to the calibration electrode of the piezoelectric element, the piezoelectric element may undergo a deformation, particularly a shrinkage, that is to say a contraction. The contraction may particularly be a transversal contraction.

In a further development of the method, the voltage amplitude of the captured voltage signal is determined. The amplitude of the voltage that is captured by means of the measurement electrode depends on the degree of deformation of the piezoelectric element. By capturing the voltage amplitude of the voltage that is captured by the measurement electrode and through the known voltage amplitude of the voltage that is applied to the calibration electrode, a calibration factor can be calculated.

In a further development of the invention, the ratio between the voltage amplitude of the excitation voltage and voltage amplitude of the measured voltage is determined, and a calibration factor is calculated from the ratio. By calculating a calibration factor, it is possible to compensate for ageing effects of the piezoelectric element, for example, which may result in a change of the piezoelectric coefficient. In this way, it remains possible to take reliable measurements even with ageing piezoelectric elements.

In a further development of the method, the excitation voltage is an alternating voltage, and the deformation of the piezoelectric element induced by the alternating voltage is an oscillation. When an alternating voltage is applied to the calibration electrode, the piezoelectric element may be caused to oscillate. These oscillations of the piezoelectric element result in a piezoelectric voltage, which may be recorded by the measurement electrode. The application of an alternating voltage and consequently the generation of an oscillation makes it possible for the measurement electrode to record reliable voltage amplitude values, so that a sure measurement method is created.

In a further development of the method, the excitation voltage is a sinusoidal excitation voltage, particularly an excitation voltage with variable frequency, particularly a frequency sweep. A voltage with variable frequency may be applied to at the calibration electrode. This voltage may be for example a sinusoidal voltage signal. In particular, the voltage signal applied to the calibration electrode may be a frequency sweep, that is to say a voltage signal with preferably rising oscillation frequency. If a characteristic oscillation signal is applied, such as an oscillation signal with frequency sweep, for example, it is then possible to reliably allocate the voltage captured by the measurement electrode to the calibration method. This prevents other deformations of the piezoelectric element which arise—as may happen during regular operation of the sensor—from being assigned to the calibration method. This in turn enables a clear distinction to be made between the voltages captured with the measurement electrode in regular mode and calibration mode.

In a further development of the method, the voltage is measured with the measurement electrode, while at the same time the calibration voltage is applied to the calibration electrode. The voltage at the measurement electrode is measured at the same time as the calibration voltage is applied to the calibration electrode. Measuring and applying the voltage at the same time makes is possible to determine the calibration factor precisely. In particular with this method, is also possible to take measurements of piezoelectric elements made from a foil material, from polyvinylidene fluoride (PVDF), for example. With foil materials, it is also almost impossible to generate excitation by applying a voltage to the measurement electrode and time-delayed measurement of the voltage induced by the deformation due to inertia of the system, because foil materials are very supple and flexible, so they hardly continue oscillating at all. Moreover, piezoelectric elements produced from foil are often bonded to carrier materials, which are very difficult to bring to oscillation or deformation by the piezoelectric foil. For these reasons, it is extremely difficult to measure a decay behaviour of an oscillation generated previously by exciting the piezoelectric foil due to the inefficient conversion of electrical energy into mechanical energy. The quality of the sensor can be measured by simultaneously measuring with a measurement electrode and excitation by the calibration electrode, since excitation and measurement take place at the same time.

In a further development of the method, the calibration electrode and the measurement electrode are both used to capture structure-borne sound signals. The measurement electrode and the calibration electrode are structurally identical to each other, so both the calibration electrode and the measurement electrode may also be used simultaneously for measurements. In this way, for example, it is possible to determine the directions from which a structure-borne sound signal to be measured reaches the sensor with the two electrodes.

In a further development of the method, a conclusion is drawn about the degree of soiling of the sensor from the excitation voltage and the voltage induced by the deformation and captured with the measurement electrode. Sensors equipped with piezoelectric elements may be used for example in automotive engineering to detect spray water or other events that generate structure-borne sound signals on the outer shell of the motor vehicle. In such applications, proper functioning depends to a critical degree on precise calibration. Particularly in the case of sensors that are used in automotive engineering in the area of the vehicle outer shell, it may happen that the sensors are exposed to environmental influences. In particular, it may happen that a sensor is covered with a heavy layer of dirt, or equally with ice and snow. Soiling of the sensor may be detected by exciting the piezoelectric element to deformation or oscillations an excitation voltage applied to the calibration electrode. The deformations may be captured via the measurement electrode. In particular, in this context an oscillation behaviour of the piezoelectric element which differs from the normal state may be captured, wherein a conclusion may be drawn about soiling or coating of the sensor from the deviation or nature of the deviation. Heavy soiling of the sensor or covering of the sensor with ice may result in the sensor not being suitable for measurement purposes in this condition. For example, heavy soiling may result in an incorrect interpretation of the measurement data captured for spray water. If heavy soiling or coverage of the sensor are captured, based an oscillation behaviour which differs significantly from the normal condition, for example an information signal may be output to the effect that the sensor is not currently available for taking measurements, for the purpose of preventing incorrect measurement results from being output, to the vehicle driver, for example.

The invention further relates to a sensor device for capturing at least one structure-borne sound signal with at least one piezoelectric element, wherein the piezoelectric element is equipped with at least one electrode embodied as a measurement electrode and wherein at least one earth electrode is assigned to the measurement electrode, in which it is provided as essential to the invention that the piezoelectric element has at least one further electrode and that the at least one further electrode is embodied as a calibration electrode, and that the calibration electrode surrounds at least portions of the measurement electrode or the measurement electrode surrounds at least portions of the calibration electrode. The sensor device is equipped with a piezoelectric element with a measurement electrode and a counter electrode, that is to say an earth electrode. Voltages that are generated for example as a result of the piezoelectric effect by deformations, oscillations or similar of the piezoelectric element may be tapped between the earth electrode and the measurement electrode. Besides the earth electrode and the measurement electrode, the sensor device includes a further electrode, which is embodied as a calibration electrode. The calibration electrode is designed to apply a voltage to the piezoelectric element. If a voltage is applied to the piezoelectric element, it can be deformed the element and/or caused to oscillate, in transversal contractions, for example. Due to the piezoelectric effect, a deformation of the piezoelectric element results in a voltage which can be captured by a measurement electrode. The quality of the piezoelectric element may be determined by comparing the voltage that is applied via a calibration electrode with the voltage originating from the deformation due to the voltage applied by the calibration electrode, which is measured by a measurement electrode. The quality of the piezoelectric element may be determined for example with the piezoelectric coefficient. This may depend on the temperature, ageing processes or the like, for example. The piezoelectric coefficient affects the voltage values captured by the measurement electrode, and therewith the accuracy of the sensor device in regular operation. The influences on the piezoelectric coefficient can be deduced by calculating a calibration factor from the comparison of the applied voltage and the measured voltage. The calibration electrode and the measurement electrode may be arranged on one plane on the piezoelectric element. For example, the measurement electrode may have an approximately rectangular base area, and the calibration electrode may be arranged around the rectangular base area of the measurement electrode in the manner of a frame. The measurement electrode may also have a circular cross section, for example, and the calibration electrode may be arranged around the measurement electrode in the form of ring segments. Sensors equipped with piezoelectric elements may be used for example to capture structure-borne sound signals in motor vehicles, particularly structure-borne sound signals which propagate on the outer shell of a motor vehicle. Sensors which are used in the area of the outer shell of a motor vehicle may be exposed to powerful environmental influences, which may result in the sensor becoming dirty or iced over for example. A sensor which is heavily coated with ice and/or dirt may result in a misinterpretation of measurement values. The degree of soiling of the sensor may be captured by the arrangement of a calibration electrode and a measurement electrode. In particular, in this way a heavy soiling of the sensor may be detected by capturing an unusual oscillation behaviour of the piezoelectric element by the measurement electrode upon excitation by the calibration electrode. When heavy soiling or a coating over the sensor is detected, a message may be output to the effect that the sensor is not ready for use, to prevent misinterpreted measurement values for example from being output to a vehicle user.

In a further development of the invention, the piezoelectric element is designed as a flat component, and the piezoelectric element is made from a foil, particularly a PVDF foil. Piezoelectric elements made of foil material can be manufactured particularly inexpensively and adapted to the desired circumstances particularly easily. The piezoelectric foils which are used in a sensor device, for example in a sensor device for capturing structure-borne sound signals are typically supported on a carrier material or also applied directly to the object that is to be monitored. When a voltage is applied to the piezoelectric element, the excitation thereof is usually manifested as separate contraction of the element rather than excitation oscillations by the object on which the piezoelectric element has been placed. This makes it very difficult to measure the subsequent oscillations of the piezoelectric element after the excitation, by applying a voltage to the measurement element, for example, because the oscillations decay quickly due to the high elasticity of the foil and the poor efficiency of transfer between the piezoelectric element and the object to be monitored. By arranging a measurement electrode and a calibration electrode, both of which may be electrically conductive connection with the electrode, it is possible to measure the voltage generated by the deformation of the piezoelectric element and excite the piezoelectric element at the same time. Consequently, it is thus not necessary to measure the subsequent oscillations of the piezoelectric element.

In a further development of the invention, the calibration electrode and the measurement electrode are arranged side by side in the same plane. The layer structure may be designed for example such that the calibration electrode and the measurement electrode are arranged on the same side of the preferably flat piezoelectric element, while the earth electrode is arranged on the other side of the piezoelectric element. This makes it easy to apply the voltage to the piezoelectric element on the calibration electrode, while the correspondingly generated voltage may be tapped at the measurement electrode.

In a further development of the invention, the calibration electrode and the measurement electrode one on top of the other. In one embodiment of the invention, the flat calibration electrode may arranged on the piezoelectric element, which is preferably also flat, and the measurement electrode may be arranged on the calibration electrode. The layer structure of the sensor would then be such that the calibration electrode and the measurement electrode are arranged on one side of the piezoelectric element, while the earth electrode is arranged on the other side of the flat piezoelectric element.

BRIEF DESCRIPTION OF THE DRAWINGS

In the following section, the invention will be explained further with reference to an exemplary embodiment thereof represented in the drawing. In detail, the diagrammatic representations show in FIG. 1: a top view of a sensor device with calibration electrode and measurement electrode arranged side by side.

DETAILED DESCRIPTION OF THE PREFERRED EMBODIMENTS

Figure 1:
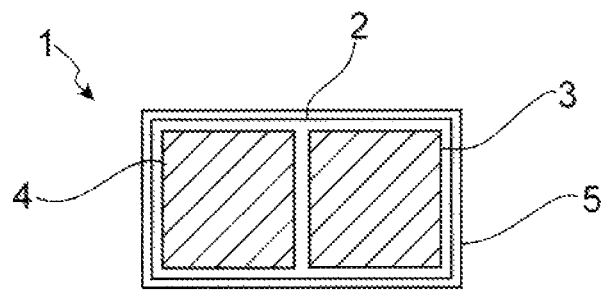

FIG. 1 represents a sensor device 1 having a piezoelectric element 2. Piezoelectric element 2 is preferably made from a foil material, particularly polyvinylidene fluoride (PVDF). A measurement electrode 3 and a calibration electrode 4 are arranged on the flat piezoelectric element 2. Measurement electrode 3 and calibration electrode 4 are also of flat construction and are arranged side by side in the same plane on piezoelectric element 2. An earth electrode 5 or also a counter or ground electrode is arranged on the side of the piezoelectric element 2 on which the measurement electrode 3 and the calibration electrode 4 are not arranged. Earth electrode 5 is assigned to measurement electrode 3 and calibration electrode 4. The application of a voltage to calibration electrode 4 causes a deformation or oscillation of piezoelectric element 2. The deformation or oscillation of piezoelectric element 2 due to the piezoelectric effect may be captured by the measurement electrode 3. The quality of the piezoelectric element 2, particularly of the piezoelectric coefficient of piezoelectric element 2, may be ascertained by comparing the voltage applied to the calibration electrode 4 and the voltage measured by the measurement electrode 3.

Figure 2:
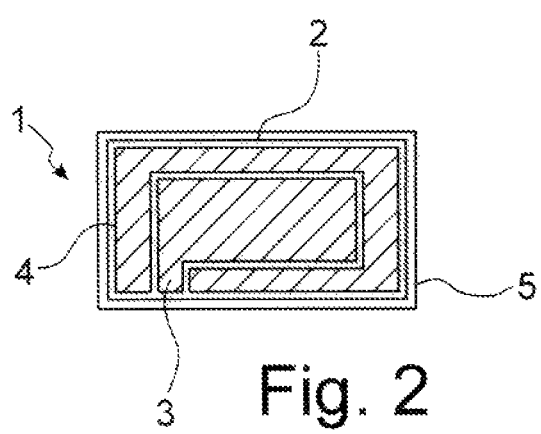
FIG. 2: a top view of a sensor device with a measurement electrode and a frame-like calibration electrode.

FIG. 2 represents a sensor device 1 with a piezoelectric element 2. The measurement electrode 3 is substantially rectangular in shape and surrounded by the substantially frame-like calibration electrode 4. The arrangement of measurement electrode 3 and calibration electrode 4 enables the measurement electrode 3 to measure the deformation of the piezoelectric element 2 induced by calibration electrode 4 particularly well.

Figure 3:
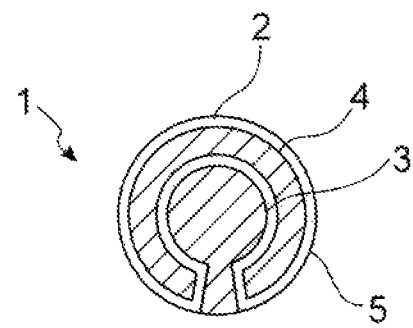
FIG. 3: a top view of a sensor device with an approximately circular measurement electrode and an annular calibration electrode.

FIG. 3 represents a sensor device 1 with a piezoelectric element 2. The measurement electrode 3 is substantially circular in shape and is surrounded by the substantially annular calibration electrode 4. This geometric arrangement favours the transmission to measurement electrode 3 of deformations induced in piezoelectric element 2 by applying a voltage to calibration electrode 4.

Figure 4:
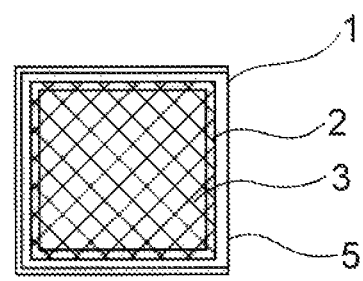
FIG. 4: a top view of a sensor device with calibration electrode and measurement electrode arranged one on top of the other.

FIG. 4 represents a sensor device 1 with a piezoelectric element 2 and a measurement electrode 3 and a calibration electrode 4. The calibration electrode 4 and the measurement electrode 3 are arranged one above the other. This forms a layer structure in which the piezoelectric element 2, in the form of a PVDF foil, for example, is arranged between the calibration electrode 4 and the earth electrode 5, and in which the calibration electrode 4 is arranged between the measurement electrode 3 and the piezoelectric element 2.

Figure 5:
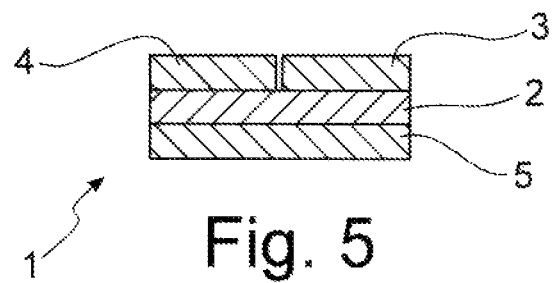
FIG. 5: a lateral cross section through a sensor device with a calibration element and a measurement element arranged side by side.

FIG. 5 represents a cross section of a sensor device 1 according to FIG. 1. The layer structure shows that the calibration electrode 4 and the measurement electrode 3 are arranged side by side in the same plane on the piezoelectric element 2. The earth electrode 5 is arranged on the side of the piezoelectric element 2 which does not support the other electrodes. Similar cross sections are also obtained for the sensor devices according to FIGS. 2 and 3.

Figure 6A:
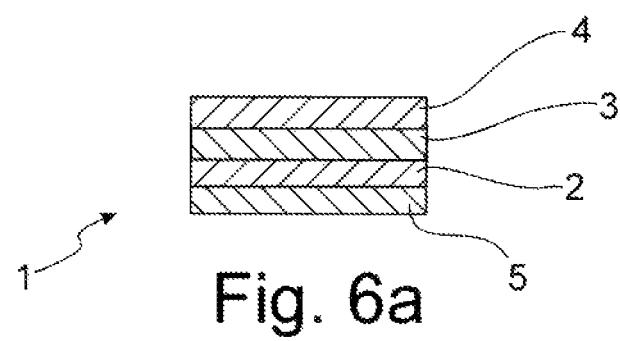
FIG. 6a: a lateral cross section through a sensor device with a calibration element and a measurement element arranged one on top of the other.

FIG. 6a represents a side view of a cross section through a sensor device 1 according to FIG. 4. A layer structure is formed in which the earth electrode 5 is arranged on the one side of the piezoelectric element 2 and the measurement electrode 3 and the calibration electrode 4 are arranged on the other side of the piezoelectric element 2.

Figure 6B:
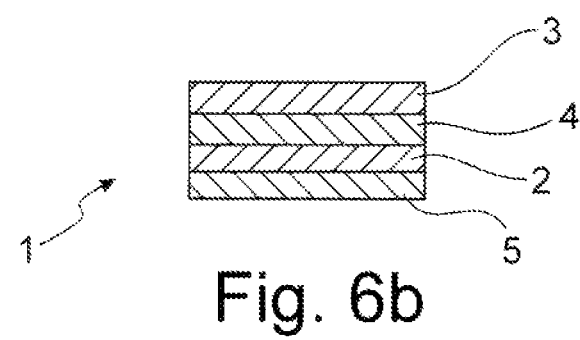
FIG. 6b: a lateral cross section through a sensor device with a calibration element and a measurement element.

FIG. 6b represents a layer structure of a sensor device 1 according to FIG. 4. In this layer structure, the calibration electrode 4 is arranged directly on the piezoelectric element 2, while the measurement electrode 3 is arranged on the calibration electrode 4. The earth electrode 5 is arranged on the side of the piezoelectric element 2 which does not support the measurement electrode 3 and the calibration electrode 4.

All the features described in the preceding description and in the claims can be combined in any permutation with the features of the independent claims. The disclosure of the invention is thus not limited to the feature combinations that are described and claimed, but rather all feature combinations that are practicable within the scope of the invention are to be considered disclosed.

What is claimed:

1. A method for calibrating at least one sensors, wherein the sensor includes only one piezoelectric element with at least one electrode, and wherein at least one electrode is embodied as a measurement electrode, wherein the method comprises:
    applying an electrical excitation voltage to at least one further electrode of the only one piezoelectric element embodied as a calibration electrode, generating a mechanical deformation of the piezoelectric element,
    capturing a voltage induced by the deformation of the piezoelectric element with at least one measurement electrode,
    comparing the applied electrical excitation voltage and the captured voltage,
    calculating an electrical field formed between the calibration electrode and the measurement electrode, and
the calculation of the electrical field is included in in calculating a calibration factor.

2. The method according to claim 1, wherein the deformation of the piezoelectric element is a contraction, particularly a transversal contraction.

3. The method according to claim 1, wherein a voltage amplitude of the captured voltage is determined.

4. The method according to claim 1, wherein the ratio between a voltage amplitude of the electrical excitation voltage and a voltage amplitude of the captured voltage is determined and the calibration factor is calculated from the ratio.

5. The method according to claim 1, wherein the electrical excitation voltage is an alternating voltage and that the deformation of the piezoelectric element induced by the alternating voltage is an oscillation.

6. The method according to claim 1, wherein the electrical excitation voltage is a sinusoidal excitation voltage, in particular a voltage with varying frequency, in particular a frequency sweep.

7. The method according to claim 1, wherein the electrical excitation voltage is applied to the calibration electrode at the same time as the captured voltage is measured with the measurement electrode.

8. The method according to claim 1, wherein the calibration electrode and the measurement electrode are both used to capture structure-borne sound signals.

9. The method according to claim 1, wherein a conclusion is drawn about a degree of soiling of the sensor from the electrical excitation voltage and the captured voltage induced by the deformation of the piezoelectric element which is captured with the measurement electrode.

* * * * *